(12) United States Patent
Kouznetsov

(10) Patent No.: US 8,262,869 B2
(45) Date of Patent: Sep. 11, 2012

(54) WORK PIECE PROCESSING BY PULSED ELECTRIC DISCHARGES IN SOLID-GAS PLASMA

(75) Inventor: Vladimir Kouznetsov, Nynashamn (SE)

(73) Assignee: Chemfilt Ionsputtering Aktiebolag, Linkoping (SE)

( * ) Notice: Subject to any disclaimer, the term of this patent is extended or adjusted under 35 U.S.C. 154(b) by 1449 days.

(21) Appl. No.: 10/563,864

(22) PCT Filed: Jul. 9, 2004

(86) PCT No.: PCT/SE2004/001129
§ 371 (c)(1),
(2), (4) Date: Jun. 8, 2006

(87) PCT Pub. No.: WO2005/005684
PCT Pub. Date: Jan. 20, 2005

(65) Prior Publication Data
US 2006/0278518 A1 Dec. 14, 2006

(30) Foreign Application Priority Data

Jul. 10, 2003 (SE) ...................................... 0302045

(51) Int. Cl.
C23C 14/00 (2006.01)
C23C 14/32 (2006.01)
C25B 9/00 (2006.01)
C25B 11/00 (2006.01)
C25B 13/00 (2006.01)

(52) U.S. Cl. ......... 204/192.13; 204/192.12; 204/298.03; 204/298.06; 204/298.08

(58) Field of Classification Search ............. 204/192.12, 204/192.13, 298.03, 298.06, 298.08
See application file for complete search history.

(56) References Cited

U.S. PATENT DOCUMENTS 5,492,606 A 2/1996 Stauder et al.
(Continued)

FOREIGN PATENT DOCUMENTS

EP 1 094 493 4/2001
(Continued)

OTHER PUBLICATIONS

International Search Report for PCT/SE2004/001129 dated Nov. 2, 2004.

(Continued)

*Primary Examiner* — Jonathan Johnson
*Assistant Examiner* — Michael Band
(74) *Attorney, Agent, or Firm* — Hiscock & Barclay, LLP

(57) ABSTRACT

Work piece processing is performed by pulsed discharges between an anode (2) and a magnetron sputtering cathode (1) in solid-gas plasmas using a chamber (2) containing the work piece (7). A system (12) maintains a vacuum in the chamber and another system (14) provides sputtering and reactive gases. The pulses are produced in a plasma pulser circuit including the anode and the cathode, the discharges creating gas and partially ionized solid plasma blobs (3) moving or spreading from a region at a surface of the cathode towards the work piece and the anode. A potential is applied to the work piece so that a pulsed current comprising biasing pulses arises between the second electrodes. In particular biasing discharges are produced between the anode and the work piece when said plasma blobs have spread to regions at the anode and at the work piece so that the pulsed current is the current of these biasing discharges. The method is efficient for processing or modifying surface regions of work pieces of various kinds and configurations and can be employed for achieving efficient work piece etching, interface mixing, surface and balk diffusion, gas absorption and desorption, initial and further stages of thin film condensation, and for performing ion plating.

24 Claims, 5 Drawing Sheets

U.S. PATENT DOCUMENTS 6,413,382 B1 7/2002 Wang et al.
2004/0112735 A1* 6/2004 Saigal et al. ............. 204/192.12

FOREIGN PATENT DOCUMENTS

| EP | 1 106 709 | | 6/2001 |
| JP | 07150348 A | * | 6/1995 |
| WO | 01/98553 | | 12/2001 |

OTHER PUBLICATIONS

Wang et al., *Tribological and optical properties of crystalline and amorphous alumina thin films grown by low-temperature reactive magnetron sputterdeposition*, Surface & Coatings Technology, vol. 146-147, 2001, pp. 189-194.

* cited by examiner

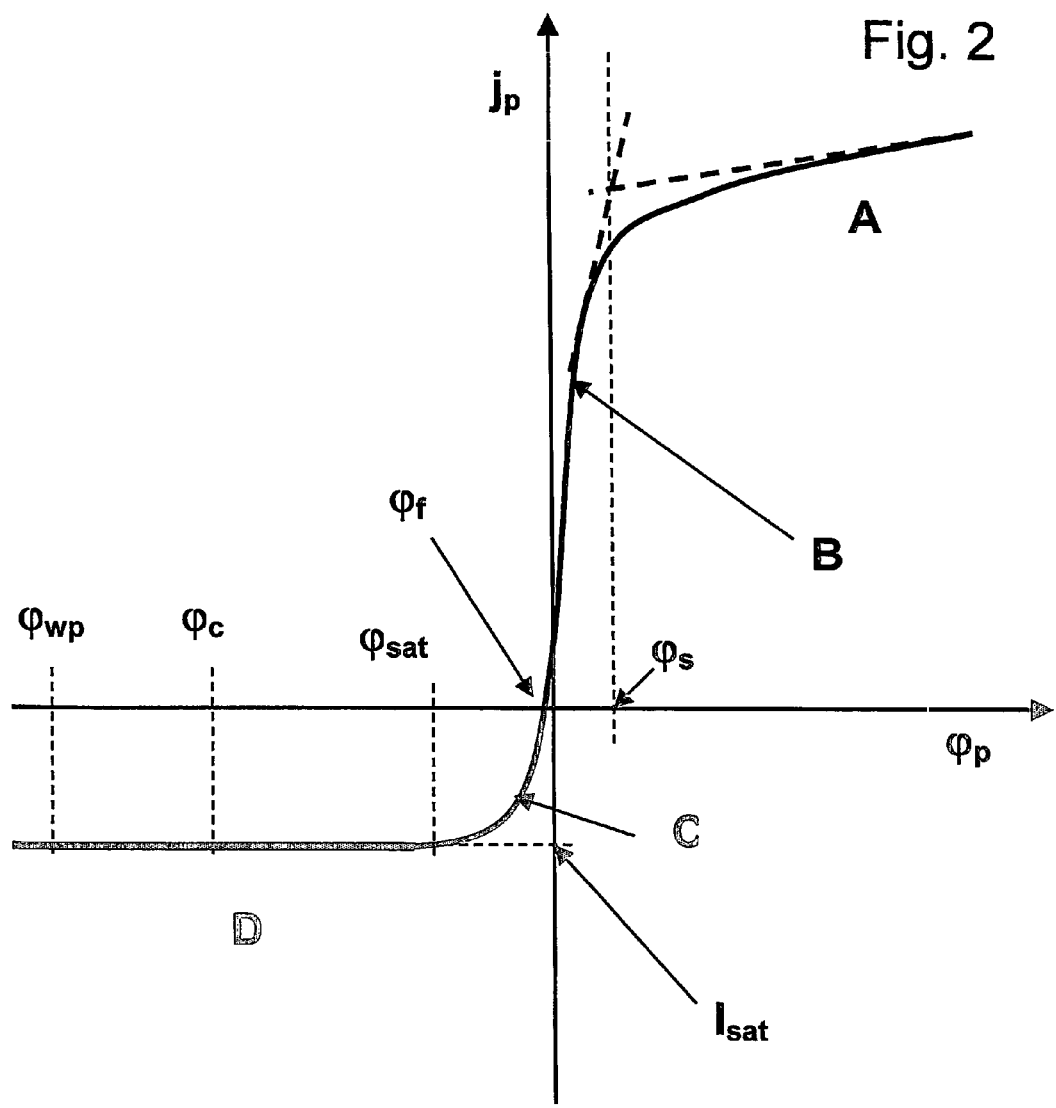

WORK PIECE PROCESSING BY PULSED ELECTRIC DISCHARGES IN SOLID-GAS PLASMA

RELATED APPLICATIONS

This application is the U.S. national phase of International Application No. PCT/SE2004/001129 filed 9 Jul. 2004, which designed the U.S. and claims priority to SE 0302045-0 filed 10 Jul. 2003, the entire contents of each of which are incorporated herein by reference.

FIELD OF THE INVENTION

The present invention relates to processing work pieces by high current pulsed electric discharges in solid-gas plasmas, produced by high current pulsed discharges in a gas located in a magnetron magnetic field configuration.

BACKGROUND

Deposition techniques based on surface modification and thin film condensation by gas/metal plasmas play an increasing role in coating processes for different applications, in particular for making mechanical, electronic, protective and optical coatings. A main advantage of plasma assisted technology is derived from the possibility of varying the energy and trajectories of ions arriving from a plasma to a work piece surface during surface preparation for thin film deposition and initial and further stages of thin-film growth. Variation of ion energy and trajectories can be achieved by work piece biasing. Another advantage of surface modification of work pieces by the plasma assisted technology is related to the extremely high chemical activity of a plasma. Therefore, in using plasma technology it is possible to achieve such chemical reactions that cannot be obtained using conventional methods.

In the following primarily only physical phenomena associated with plasmas will be considered. In particular, the influence of the energy and the space velocity distribution of plasma ions on different phases of surface preparation of work pieces and thin film growth on work pieces will be considered.

Generally, it can be said that the energy of ions incident to a surface of a body can influence such physical processes as gas adsorption and desorption, sputtering, ion implantation, ion deposition or ion plating, collision induced thermal exchange and collision induced surface and bulk diffusion. In particular, increasing the energy of incident ions has many effects that are analogous to effects caused by elevating the temperature of the work pieces.

In regard of surface preparation for thin film condensation ion caused effects of interest are work piece surface cleaning/sputtering, bulk diffusion, and interface mixing. These phenomena are used for increasing the adhesion of a deposited film to a work piece. The efficiency of these processes depends on parameters of the plasma accommodated in a plasma reactor and the biasing voltage used. The higher plasma density the lower biasing potential is required. In a method of processing work pieces using pulsed plasmas, see W-D. Munz, published European patent application No. 1260603, is, because of the low metal plasma density used, such an exotic method as ion implantation used for increasing the adhesion of deposited films. It requires a high biasing voltage, of about 2 kV, and a presence of second and third ions in metal plasmas. To achieve such ions electric discharges with extreme parameters are required. It is obvious that this method has a very limited practical value. More sophisticated methods of processing work pieces using pulsed plasmas are based on the use of methods of plasma production by an increased metal plasma density.

In the conventional deposition method using magnetron sputtering an increased plasma density is usually achieved by an enhanced plasma confinement using open magnetic traps of cusp or mirror geometry, see the book by D. J. Rose and M. Clark, "Plasmas and Controlled Fusion", M.I.T. Press and John Wiley & Sons, Inc., New York-London, 1961, Northrop T. G. and Teller E., "Stability of adiabatic motion of charged particles in the earth field", Phys. Rev., No. 117, pp. 215-225, 1960, published Great Britain patent application No. 2 258 343, U.S. Pat. No. 5,554,519, and published European patent No. 0521045. By the use of plasma confinement it is possible to achieve a magnitude of the biasing current in conventional magnetron sputtering that is approximately 100 times greater than in systems not using any magnetic confinement. Plasma confinement and an increased plasma density allow a reduction of the biasing voltage in a cleaning phase down to 1000-600 V, see S. Kadlec et al., "TiN films grown by reactive magnetron sputtering with enhanced ionization at low discharge pressure", Vacuum, 41 (7-9) 1990, pp. 2233-2238, the cited Great Britain patent application No. 2258343, U.S. Pat. No. 5,554,519 and European patent No. 0521045. However, the use of only plasma confinement does not allow achieving metal plasma parameters that are necessary for an efficient use of the processes as described by Cheng et al. and Gilmore et al, see the discussion below.

Cheng et al., see Y-T. Cheng et al., "A comparison between high- and low-energy ion mixing at different temperatures", Nucl. Instrum. Methods Phys. Res. B, 64, 1992, pp. 38-47, showed that ballistic mixing, i.e. primary and secondary knock-on events between ion and atoms in the solid, depends only on bombarding ions and target atoms masses and initial ions energy. Gilmore and Sprague, see C. M. Gilmore and J. A. Sprague, J., "Molecular-dynamics study of film growth with energetic Ag atoms", Vac. Sci. Technol. A. 10, 1992, pp. 1597-1599, investigated the ion stimulated thermal exchange process. The influence of the energy and thermodynamics of the ions on the ion stimulated thermal exchange was evaluated by studies of their molecular dynamics. It was found, see G. K. Hubler, J. A. Sprague, "Energetic particles in PVD technology: particle-surface interaction process and energy-particle relationship in thin film deposition", Surface and Coating Technology 81, 1996, pp. 29-35, that for an incident energy of the ions in the range of 1-40 eV, the number of atoms in the film mixed into the work piece varies from units up to more than a hundred. This result was obtained by molecular dynamics simulation of 200-atom of Pt deposited on Cu-film.

The energy of atoms sputtered from magnetron sputtering cathodes is of the magnitude of order of 1 eV. It is obvious that interface mixing by film deposition using preferably metal vapor is more problematic than using plasma deposition because plasma ions can be accelerated up to high energy by work piece biasing. Moreover, the integral intensity of interface mixing is larger the higher is the ionization rate of gas and vapor in the process chamber and the higher is the work piece biasing voltage. In simple words, a higher rate both of gas and metal vapor ionization and of work piece biasing has to have a positive influence on the adhesion between a thin film and a work piece.

Plasma assisted film growth can be described particularly by phenomena occurring in ion plating. Ion plating is a term used for atomistic film deposition processes in which the work piece surface and a growing film are subjected to a flux of energetic particles sufficient to cause changes in the interfacial region or film properties compared to the non-bombardment deposition. This term is used in coating technology in the cases where a thin film is deposited by a neutral vapor or a plasma in a highly ionized atmosphere. Ion plating affects adhesion and film properties. In particular, if energetic ions are involved in the condensation process, they increase the mobility of the already absorbed atoms, increase the reactivity of the condensation process and contribute to the heating of the work piece. They produce conditions similar to those which occur at elevated temperatures. Messier et al., see R. Messier et al., "Revised structure zone model for film physical structure", J. Vac. Sci. Technol. A 2(2), April-June 1984, pp. 500-503, found that the minimum temperature limit for precipitation of dense smooth coatings by intensive ion bombardment also drops with increasing the biasing voltage.

The density and microstructure of deposited hard material coatings can be influenced both by the biasing voltage, i.e. the energy of the bombarding ions, and the current density resulting from the biasing voltage. The structure of deposited films becomes dense if the biasing current density is increased.

Integrated semiconductor circuits generally include many layers of different materials such as dielectric, semiconductor or conductor materials. For developing these materials and in particular deposition methods for depositing material deeply into narrow holes by magnetron sputtering much effort has been made. A main problem arising in this process is the randomised velocity space distribution of neutrals and ions that are used for filling vias or for depositing material in vias. That results in a non-directional via deposition. Therefore, the filling of vias having an aspect ratio of more than about 5:1 becomes difficult but modern and future technology requires an increase of the aspect ratio up to 8:1, 10:1 and more. The solution of this problem is based on replacing vapor deposition by plasma deposition and transformation of the random space distribution of the velocity of the metal ions used into a directional velocity space distribution by a negative biasing of the work piece, also called a substrate. It is obvious that in order to achieve a higher effect of the biasing, it is necessary to have a high metal vapor ionization degree.

Generally speaking, it can be said that the use of methods and corresponding apparatus for plasma processing of work pieces requires development both of methods and apparatus for plasma production and of methods and apparatus for work piece biasing.

For increasing the metal vapor ionization degree such methods as SIP, "Self Ionized Plasma", SSS, "Sustained Self Sputtering", and the method briefly called Multi-Pole Hollow Cathode Target have been developed, see for example U.S. patent application Ser. No. 09/373,097, filed Aug. 12, 1999 for Fu, U.S. patent application Ser. No. 09/414,614, filed Oct. 8, 1999 for Chiang, and U.S. Pat. No. 5,178,739 for Barnes. The methods for plasma generation mentioned above have many disadvantages. The main disadvantages include a very high average target power, costly power supplies, and a complicated target cooling procedure.

In 1998 V. Kouznetsov suggested, see the published International patent application No. WO 98/40532, filed Mar. 11, 1998, assigned to Chemfilt R & D AB, and U.S. Pat. No. 6,296,742, that for generation of dense plasmas high current pulsed discharges in crossed fields can be used. The discharges are made in a magnetron magnetic configuration in such way that simultaneously with the sputtering process the ionization of metal vapor and sputtering and reactive gases is achieved by the same discharge. Any additional RF ionization is not required.

The suggested method received interest from the industry, see U.S. Pat. No. 6,413,382 for W. Wang at al., and from basic science, see V. Kouznetsov et al., "A novel pulsed magnetron sputter technique utilizing very high target power densities", Surf. Coat. Technol., 1999, 122(2-3), pp. 290-293, K. Macak et al., J. "Ionizing sputter deposition using an extremely high plasma density pulsed magnetron discharge", Vac. Sci. Technol. A (Parts 1 and 2), 2000, 18(40), pp. 1533-1537, and A. Ehiasarian et al., "Influence of high power densities on the composition of pulsed magnetron plasmas", Vacuum 65, 2002, pp. 147-154.

Simultaneously with development of different methods and apparatus for gas and metal plasma production, also work is presently carried out to develop methods and apparatus of work piece processing, in particular biasing.

R. Gruen has in U.S. Pat. No. 5,015,493 described pulsed biasing of work pieces in such a way that the work piece is a first electrode of pulsed discharges and the metal vapor source is the second electrode. Both the work piece and the vapor source are connected in a serial way to a pulsed power supply and discharge gap. The metal vapor source can be a magnetron sputtering cathode, an evaporation source or an electric arc. In the case of a sputtering cathode the cathode has a negative potential in relation to the work piece that is the anode of the discharge. In this case only neutral vapor is accumulated on the work piece and the biasing current is an electron current. The disclosed process can also be used in combination with an evaporation source and electric arc. In that case a work piece is the cathode of the discharge and the vapor source, i.e. the evaporator or the arc, is the anode. In this patent only an ion plating process is described. It means that interface mixing, sputtering, diffusion, implantation and other processes are not possible. It is so because of a low metal vapor ionization rate and narrow limits of discharge parameters. Discharge parameters are limited by the power corresponding to the narrow limits of the abnormal glow discharges that are required to balance energy losses. The other weakness of this method is that the same discharge is used for plasma production and ion plating. In the use of this method of work piece biasing it is not possible to vary the voltage and current of the plasma production discharge and the biasing voltage and current independently of each other.

A. Belkind has in the published International patent application No. WO 01/29278 described a method and apparatus for work piece biasing in a multielectrode sputtering system. In particular, a method and apparatus are disclosed for causing ion bombardment of a substrate during sputter deposition of an electrically insulating or conducting material on the substrate when using sputtering methods including dual cathodes or dual anodes. A novel electrical circuit including a transformer having a center-tap is disclosed, permitting a potential to be applied to the substrate that is controllable in relation to the plasma potential, without having to provide an additional power supply. Also disclosed are methods which permit the use of a biasing supply, for either DC or high frequency AC, and which can permit a continuous discharging of the surface of the substrate through bombardment with alternatingly ions and electrons.

I. Hiroshi has in U.S. Pat. No. 6,297,165 described a method for etching and cleaning work pieces in a plasma processing apparatus wherein the plasma is generated in a vacuum chamber. To perform etching of a substrate placed on a substrate electrode a voltage monitoring conductor is provided in the vicinity of the substrate electrode, and high frequency power is supplied to both the substrate electrode and the voltage monitoring conductor. Completion of the etching operation is detected by monitoring a self-biasing potential generated in the voltage monitoring conductor.

Y. Naoki has in published U.S. patent application No. 2002/031617 described apparatus and a method for plasma processing including controlled biasing functions. The processing technique uses a plasma to process the surface of a sample such as semiconductor device. The phases of RF biasing voltages are applied to a substrate electrode and an antenna electrode located opposite each other in an alternating way so that they are controlled to be opposite to each other. Either one of the electrodes is forced to always act as having a ground potential. Therefore, the current flowing across the magnetic field for controlling the plasma is decreased, and the potential distribution difference in the surface of the sample to be processed is reduced, so that charging damages can be suppressed. The energy of ions incident to the sample to be processed can be controlled to perform high precision etching. The plasma potential can also be controlled so that the strength of the ion impact to the inner wall of the chamber can be reduced, thereby reducing the number of particles detached from the inner wall of the processing apparatus, thereby improving the throughput.

B. Terry has in the published International patent application No. WO 01/58223 described a system and method for plasma processing of work pieces. A substrate processing system includes a processing chamber, a substrate holder having a floating electrical potential and positioned in the chamber, a gas source for supplying a process gas to the chamber, at least one ion source located in the chamber, and a power source for energizing the ion source by positively biasing the anode and negatively biasing the cathode in a train of pulses of selectably variable duty cycle and magnitude to maintain a selected average current over time, the bias in each instance being relative to the chamber walls. The ion source ionizes the process gas producing ions for processing a substrate placed on the electrically floating substrate holder in the chamber. The floating substrate is biased in accord with the net electric charge thereon as controlled by the flux of energetic electrons. One embodiment includes two such ion sources. In this case, the power source energizes first and second anodes and the cathodes in a time multiplexed manner, such that only one of the first or second ion sources is energized at any time and interactions between ion sources are eliminated.

An analysis of the processing methods described above and others shows that none thereof is acceptable for processing work pieces located in a dense plasma produced by the methods described in the cited published International patent application No. WO 98/40532 and U.S. Pat. No. 6,296,742. As a result it can be said that the art needs development of methods and apparatus for processing work pieces which are suitable for high current, magnetron sputtering deposition processes. Such processing methods and apparatus have to provide efficient sputtering using a low discharge voltage, for ion implantation, interface mixing, gas adsorption and desorption, deposition, i.e. ion plating, collision induced thermal exchange and collision induced surface and bulk diffusion. In particular, such processes have to result in:

A very good adhesion.

Condensation of extremely smooth and dense films.

Transformation of chaotic ions space velocity distribution into directional.

Prior art related to the present application is also disclosed in the published International patent applications Nos. WO 01/98553 and WO 02/103078 for V. Kouznetsov and assigned to Chemfilt R&D AB.

As has been mentioned above, in 1998 it was suggested to use for generation of dense metal and gas plasma high power pulsed discharges in crossed fields. The discharges are made in a standard balanced magnetron magnetic configuration. Because of the high, pulsed discharge power simultaneously with the sputtering process the ionization of sputtering and reactive gases and metal vapor is achieved by the same discharge. Any additional RF ionization or microwave ionization is not required.

The prior method of magnetically enhanced sputtering includes the following basic steps:

(a) providing a magnetic field in a magnetron configuration at the surface of target, from which material is to be sputtered;

(b) providing a sputtering gas to be ionized in a chamber containing a target, and (c) applying a negative voltage between anode and cathode. The negative voltage is applied in pulses having such a peak voltage and so that in the application of each pulse, a rapid voltage increase is provided at the leading pulse edge in a manner so that during the rapid voltage increase at the leading pulse edge the gas located at and in the region in which the electrons are trapped by the magnetic field first adopts a glow discharge state, then continues to an arc discharge state, and thereafter to a fully ionized state creating a substantially homogeneous plasma having a high rate of ionizing the sputtering gas. Because of a low duty cycle of the discharge pulses in the sequence, $1 \cdot 10^{-7}$-10%, the pulsed power of each discharge can be very high whereas the average power is low. The pulsed power can be of order of megawatt for an average power of the magnitude of order of about one or a few milliwatts. The high, pulsed discharge power results in production of dense plasma blobs containing both gas and metal plasmas.

Another method for gas and metal production is described in the published International patent application WO 02/103078 mentioned above. The main difference of this method from that described above is that the process of plasma production is divided in two parts. First, low ionized metal vapor is produced by a low current discharge. Thereupon, a high current ionizing discharge is initialized. The difference of this method for plasma production is that the plasma contains an increased share of metal plasma and that discharges are made in various kinds of balanced and unbalanced magnetron magnetic configurations.

A high plasma density exists mainly during the time period of each high current pulsed discharge between the discharge electrodes. The discharge electrodes are located in a process chamber and/or are parts of the process chamber. The work piece or pieces are located in the process chamber as well.

It was found that the above described charge separation zone plasma can initially be concentrated inside a magnetron magnetic configuration that is a magnetic trap or is of mirror type, see the cited article by T. G. Northrop and E. Teller, and that in the case of an unbalanced magnetron magnetic configuration the plasma escapes therefrom preferably through the magnetic mirror along directions perpendicular to the cathode surface.

In U.S. Pat. No. 5,492,606 for Stauder et al. a method for self-stabilizing deposition of a stoichiometris compound using reactive sputtering is disclosed in which electric pulses or oscillations of a low frequency are superposed on a negative D.C. voltage and/or an RF-voltage to bias the target. The substrate holder can be biased by separate generators providing a DC voltage or an RF-voltage. In particular, the target can be feed with a negative DC voltage on which pulses having a frequency of 50 Hz are superposed, giving extinction of the plasma for 5 ms.

Various methods of work piece biasing have been disclosed. Thus, Wang et al., "Tribological and optical properties of crystalline and amorphous alumina thin films . . . ", Surf. and Coat. Techn., Vol. 146-147, pp. 189-194, describes that a pulsed d.c. bias was applied to both the aluminum target and the substrate to maintain a stable deposition process and high deposition rate". Pulses of 20 kHz were provided to the substrate holder and pulses of 50 KHz to the target. The DC substrat bias was −200, −250, −300 V. In published European patent applications Nos. 1106709 and 1094943 for Applied Materials metal-plasma physical vapor deposition MP-PVD is described. The substrate holder is biased using an RF-voltage appearing in bursts, each burst including a plurality of periods of the RF-voltage having a frequency of 13.56 MHz.

SUMMARY OF THE INVENTION

It is an object of the invention to provide an efficient method of processing or modifying surface regions of work pieces of various kinds and configurations.

It is another object of the invention to provide apparatus in which efficient processing or modifying of surface regions of work pieces of various kinds and configurations can be performed.

It has been found that if a work piece or work pieces is/are placed inside a magnetic trap or in the mirror field or at the side thereof, dense metal and gas plasmas and metal vapor surround the work piece or pieces during the discharge driving current pulses and that the following phenomena then exist:

The characteristic time of plasma decay after a high current pulsed magnetron discharge is about 50 ms, but pulsed plasmas are effective for work piece surface modification only during a time that is about the magnetron discharge time.

The impedance of the anode-to-work piece biasing discharge gap in high current pulsed magnetron discharges is about 10 times higher than the impedance of the anode-to-magnetron sputtering cathode discharge gap.

The amplitude of the space integral biasing current is about 10-20% of the amplitude of the discharge driving current.

These characteristics of pulsed biasing discharges can in a special process be employed for achieving efficient work piece etching, interface mixing, surface and balk diffusion, gas absorption and desorption, initial and further stages of thin film condensation, in particular for performing ion plating.

The discovered phenomena allow that work piece processing by high current pulsed discharges is performed in two different ways:

By the use of the same high current pulse supply both for metal and gas plasma production and for work piece surface modification. The magnetron sputtering cathode and the work piece are connected in parallel to the negative pole of same pulse supply and thereby to each other.

By the use of a first high current pulse supply, also called a first pulser, for plasma production and a second, high current pulser for work piece surface modification. Then the magnetron sputtering cathode and the work piece are connected to the negative pole of different pulsers.

The first method can be achieved by connecting both the magnetron sputtering cathode and the work piece or pieces to the same current pulser where the work piece or pieces can be connected to the pulser through a serially connected, variable resistor. The pulsed current from the pulser will be split in two parts: a first part constituting the discharge driving current and a second part constituting the biasing current. The time duration of both pulses is about the same but the shapes of the pulses are different from each other. The variable resistor can change the strength of the biasing current and by this way vary the value of the negative part according to the anode potential drop. If the resistance of the variable resistor is relatively low or equal to zero the potential of the work piece is equal to the potential of the magnetron cathode. The biasing potential is in this case about the potential drop over the anode and magnetron cathode. It means that the work piece is an extra cathode of discharge. The metal and gas plasmas moving or spreading towards this extra cathode are mainly supplied by the magnetron sputtering cathode. Then the effective work piece sputtering and interface mixing take place. If the resistance of the variable resistor is relatively very high, the potential drop over the resistor is relatively high and the work piece is approximately at a floating potential. Electron currents compensate the ion current and the integral current is equal to zero, see the book by R. H. Huddlestone and S. L. Leonard (Ed.), "Plasma diagnostic techniques", part Electric Probes, Academic Press, 1965. In this case film condensation with very low biasing current takes place. Between these limits all other regimes of work piece surface modification can be achieved. By this method of work piece biasing the biasing potential depends on the magnetron cathode potential and can vary from the magnetron cathode potential up to a floating potential by adjusting the resistance of the variable resistor.

The second method can be used in the case where the distance between the magnetron sputtering cathode and the work piece or pieces is sufficiently long, such as is large in relation to dimensions of the magnetron sputtering cathode and the work piece. Then, the plasma blob is spread out along the distance between the magnetron cathode and the remote work piece or pieces because the energy distribution of plasma ions is different from a δ-function and the ion velocity space distribution is not directional. Therefore, the arrival time of the plasma towards the work piece is longer than the time of magnetron plasma production discharge or, said in other words, the duration of the plasma producing discharges is smaller than the duration of the biasing discharges. The shapes of the corresponding current and voltage pulses are different as well. Therefore, an independent biasing pulser is required. By this method of work piece biasing, the biasing potential is independent of the magnetron cathode potential. Of course, this biasing method can be used also if the work piece is placed near the magnetron sputtering cathode.

In both methods of work piece biasing the magnitude of the biasing current can be at a minimum 10% of the magnitude of the magnetron discharge current that is used for producing the plasma. The peak pulsed magnitude of the biasing current depends on the work piece area and the area of the magnetron sputtering cathode and the distance between them. It can be of the magnitude of order of a few milliamperes for work pieces having a relatively small area or for cathodes of small dimensions. The space integral biasing current for large space magnetron sputtering cathodes can be of the magnitude of order of one or a few kiloamperes. The characteristic power of the pulsed biasing discharges is of the magnitude of order of a few megawatts.

The plasma blob has inhomogeneous plasma parameters along its direction of motion. Different portions of the blob arrive at the diode discharge gap, i.e. the gap between the anode and the work piece, this resulting in fast variations of the gap impedance because of plasma parameter variations. It causes in turn a fast variation of the biasing discharge current. It has been found that the characteristic speed of the front portions of the blob is of the magnitude of order of $10^6$ cm/s and that the characteristic length of plasma parameter variation is about 1 cm. It means that the biasing current pulse width has to be larger than a length corresponding to a frequency of more than 1 MHz. The data described above allow formulating the limits of output parameters of biasing current pulsers for magnetron sputtering cathodes of different dimensions or for clusters of cathodes. The upper level of these parameters is up to a few kiloamperes and a few megawatts.

In general, the main principle of work piece processing pulser design and operation is as follows. The pulser comprises a source of electric energy. The energy source is connected to the anode-to-work piece discharge gap that is the part of the pulser. The biasing current pulse is produced by a periodical connection of the discharge electrodes to each other, this connection being automatically produced by the pulsed plasma. Hence, the biasing pulse starts after the front part of the plasma blob has arrived to these electrodes, i.e. to the anode and the work piece. The pulse is terminated after decay of the plasma blob has been completed. This process is repeated in time by an independent plasma pulser that supplies the plasma blobs moving or spreading towards the electrodes of the biasing current pulser.

The plasma pulser is a pulsed magnetron plasma source. The plasma pulser supplies partially ionized metal vapor and gas plasma moving towards the work piece. The rate of metal/solid vapor ionization can be varied from 1% up to 99% by varying the pulsed magnetron discharge parameters. Dependent on gas/solid plasma parameters, on the rate of metal plasma ionization and the work piece processing/biasing pulses for example the following processes can be performed:

Work piece sputtering.
Interface formation.
Thin film deposition.

For work piece sputtering the deposition rate is lower than the sputtering rate. For interface formation the deposition rate is equal to the sputtering rate. For thin film deposition the deposition rate is higher than the sputtering rate.

The characteristics and parameters of the plasma blob and the plasma processing pulses are generally variable and by varying them e.g. the following special processes for work pieces can be performed: gas desorption, sputtering, interface mixing, ion implantation, collision induced thermal exchange and collision induced surface and bulk diffusion, ion plating, work pieces bulk and surface heating, solid thin film deposition and reactive thin film deposition.

In the process, a solid vapor ionization of a degree ranging from 1% up to 99% can be used and a variable ratio between solid plasma and gas plasma density ranging from 1% up to 99%.

The plasma blobs can be produced by pulsed electric discharges in various magnetic configurations such in a balanced magnetron magnetic geometric configuration, in an unbalanced magnetron magnetic geometric configuration, in a balanced magnetron magnetic configuration combined with an unbalancing electromagnetic coil, in a cluster of balanced magnetrons or of unbalanced magnetrons, in a system comprising a cusp magnetic trap and magnetrons, in a system comprising mirror magnetic trap and magnetrons, in an ABS deposition system manufactured by HAUZER TECHNOCOAT, or in a deposition system according to U.S. Pat. No. 6,413,382 for Wang et al., assigned to Applied Materials, or in a deposition system according to the cited International patent application No. WO 01/98553.

The energy source, that is independent of the magnetron discharge energy source, for supplying in particular the biasing pulses can be a single polarity high frequency pulsed power supply operating in a continuous regime, a single polarity high frequency pulsed power supply operating in a pulsed regime, a double or reversed polarity high frequency pulsed power supply operating in a continuous regime, a double or reversed polarity high frequency pulsed power supply operating in a pulsed regime, an RF generator operating in a continuous regime, or an RF generator operating in a pulsed regime.

The processing/biasing pulses are more or less synchronized with the plasma generating pulses but always appear with the same frequency.

The connecting and disconnecting of the work piece from the electrodes can preferably be performed using solid-state switches.

The discharges can be produced in a noble gas, e.g. Ar, in nitrogen, in oxygen in a gas mixture of carbon and hydrogen and generally in any suitable mixtures of gases.

The discharges can be produced in a gas/gases having a pressure in the range of $0.1$-$1 \cdot 10^{-10}$ Torr.

The characteristics of the biasing pulses parameters can be selected depending on the area of the magnetron sputtering cathode.

The work piece processing discharges can be used for deposition of all kinds of nitrides, of all kinds of carbonitrides, of all kinds of oxides, for deposition of monolayers and multilayers and for deposition of metal plasmas into pores, trenches and vias.

Additional objects and advantages of the invention will be set forth in the description which follows, and in part will be obvious from the description, or may be learned by practice of the invention. The objects and advantages of the invention may be realized and obtained by means of the methods, processes, instrumentalities and combinations particularly pointed out in the appended claims.

BRIEF DESCRIPTION OF THE DRAWINGS

While the novel features of the invention are set forth with particularly in the appended claims, a complete understanding of the invention, both as to organization and content, and of the above and other features thereof may be gained from and the invention will be better appreciated from a consideration of the following detailed description of non-limiting embodiments presented hereinbelow with reference to the accompanying drawings, in which:

FIG. 2 is a diagram of a graph representing a biasing discharge current density as a function of a biasing potential.

DETAILED DESCRIPTION

For processing a work piece, in particular for modifying the surface thereof, a pulsed ion current can be applied to flow between an anode and the work piece through a periodically produced dense plasma supplied by an independent pulsed plasma generator that is operating in a pulsed regime with a magnetron sputtering cathode. The plasma can be composed of ionized gas atoms and ionized metal atoms, i.e. of gas and metal plasmas. The metal atoms are sputtered from some metal surface to form a metal vapor that is partly ionized and the ratio between the metal plasma portion and the metal vapor portion, i.e. the metal vapor ionization degree or rate, as well as the ratio between ionized metal atoms and ionized gas atoms in the plasmas are variable. The anode and the work piece act together as an electric diode such as in a discharge system. The plasma is produced by high current pulsed electric discharges between the anode and the magnetron sputtering cathode. Discharges are produced in the mixture of gas plasma and metal plasma/vapor. The metal vapor is produced and ionized simultaneously with gas ionization by the same discharge between the magnetron sputtering cathode and the anode.

Figure 1A:
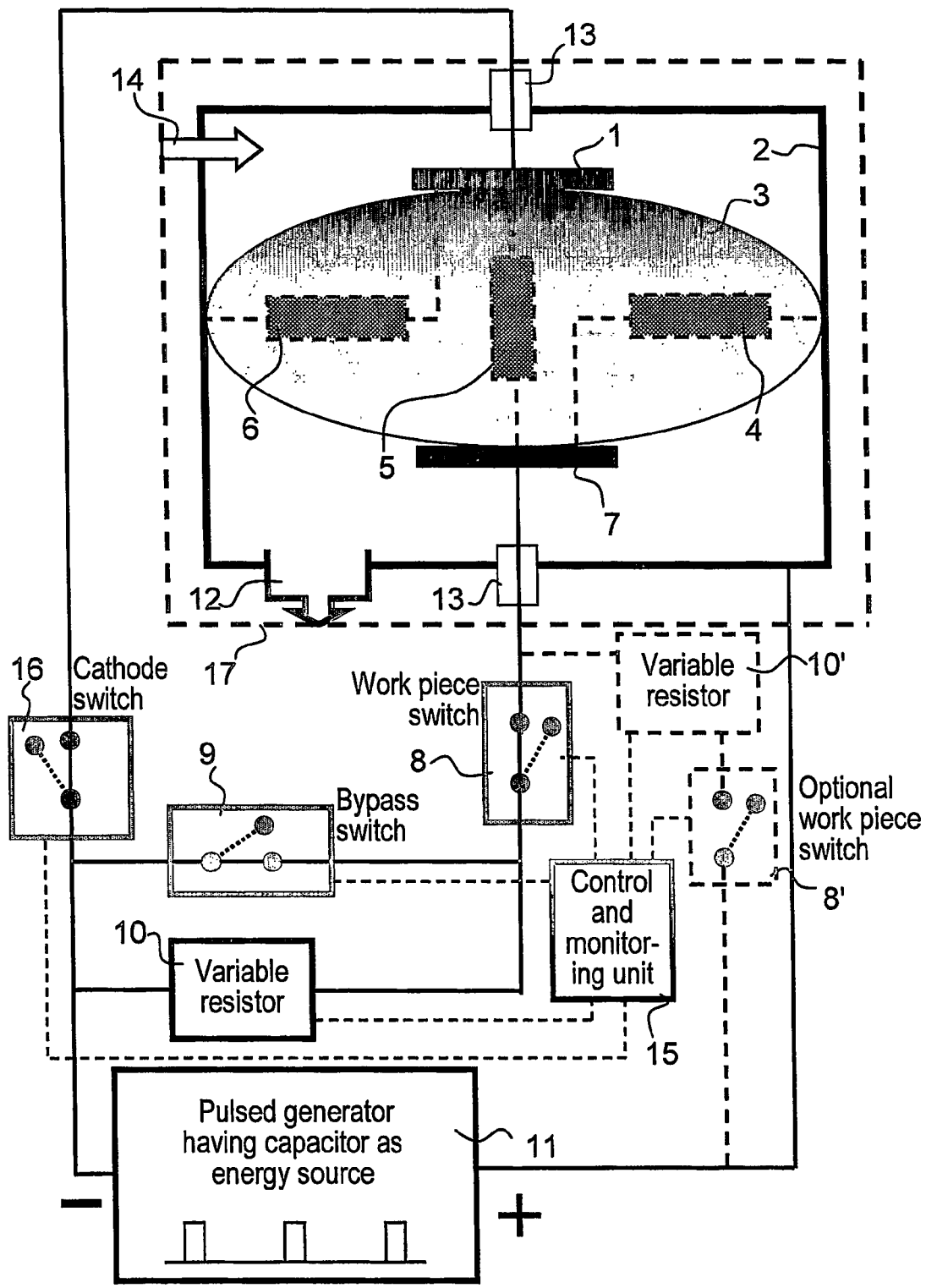
FIG. 1a is a schematic illustrating a plasma reactor and an electric circuit diagram and principles of its operation, the reactor driven by the same pulser both for plasma production and work piece biasing.
Figure 1B:
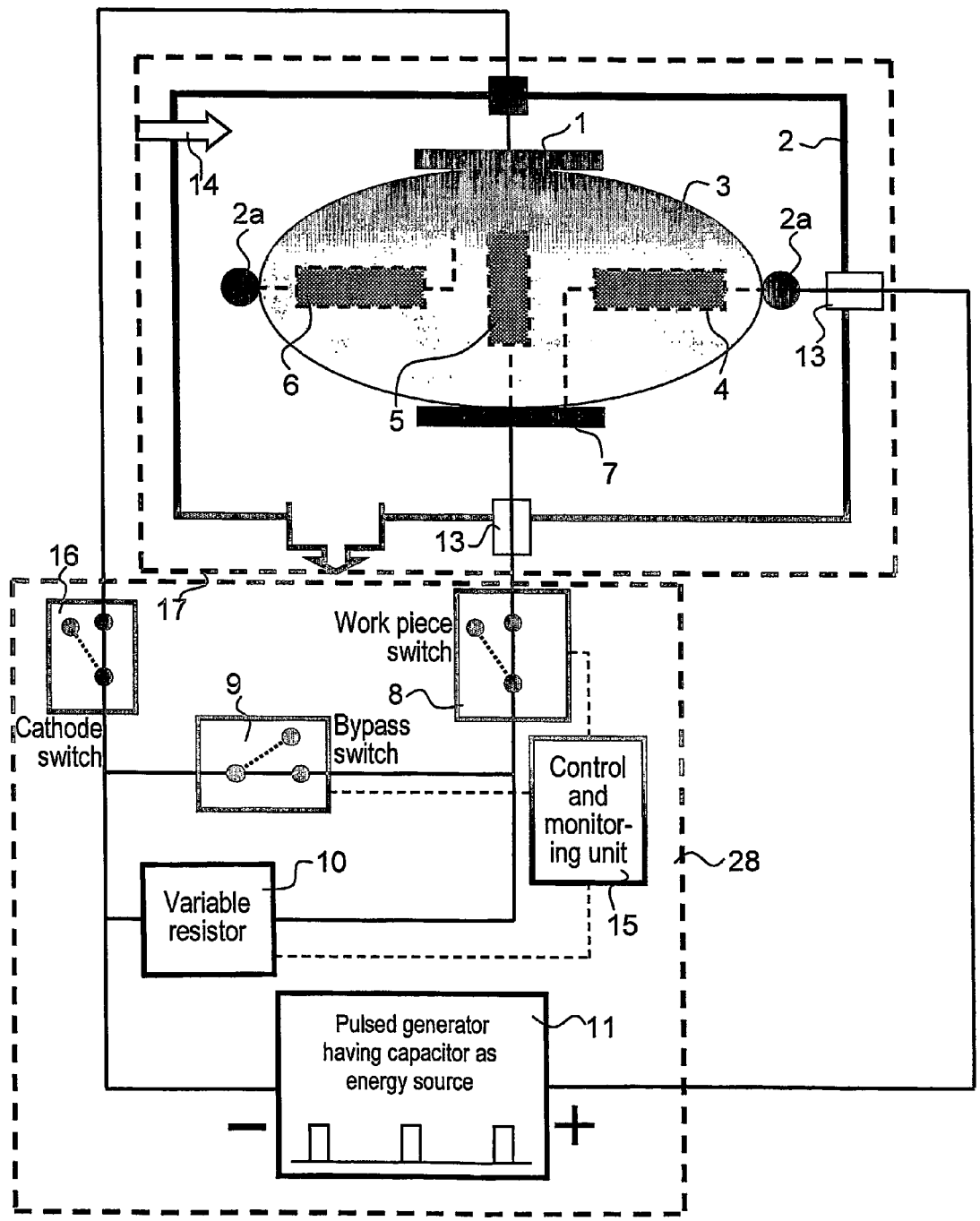
FIG. 1b is a schematic similar to FIG. 1a illustrating a plasma reactor having an extra or separate anode.

A process for modifying the surface or surface layer of a work piece will now be described with reference to the schematic diagrams of FIGS. 1a and 1b illustrating two embodiments of a plasma reactor and associated devices.

The plasma reactor 17 comprises:

A magnetron sputtering cathode 1 that can be of internal or external mounting in relation to the reactor vessel or process chamber 2. In FIGS. 1a and 1b an internally mounted magnetron sputtering cathode is shown.

A process chamber 2 that is a closed vessel which is made e.g. from stainless steel and the conducting walls of which can constitute the anode, see FIG. 1a.

A separate anode 2a that is located inside the process chamber 2 and serves as the anode instead of the walls of the process chamber, see FIG. 1b.

A work piece 7, suitably located opposite the magnetron sputtering cathode 1, at an adapted distance therefrom.

An outlet 12 provided in a wall of the process chamber 2 and connected to a vacuum pump, not shown, for maintaining a vacuum in the process chamber, i.e. a relatively low or very low pressure, e.g. as described in the cited U.S. patent for Kouznetsov.

Electrical insulators 13 in the walls of the process chamber for letting through electrically isolated electrical cables connected to the magnetron sputtering cathode 1 and the work piece 7, see FIG. 1a, or to the work piece 7 and the separate anode 2a, see FIG. 1b. In the embodiment of FIG. 1b the cathode 1 can be electrically connected to the walls of the process chamber 2.

A system indicated by the arrow 14 for supplying sputtering gas and reactive gas/gases, this system comprising one or more inlets provided in the walls of the process chamber 2 and further comprising gas sources, pumps, etc., not shown, the gases provided at relatively low or very low pressures, e.g. as described in the cited U.S. patent for Kouznetsov.

A combined pulsed generator 11, also called pulser, that can include a capacitor together with a charging device and a basic energy source, not shown, provides energy for both current pulses for producing plasmas and workpiece biasing current pulses. In the embodiment of FIG. 1a that includes no separately arranged anode, the positive pole of the pulsed generator is connected directly to the walls of the process chamber 2. In the embodiment of FIG. 1b including a separately arranged anode, the positive pole of the pulsed generator is accordingly connected directly to the separate anode 2a. The negative pole of the pulsed generator 11 is connected to the magnetron sputtering cathode 1 through a cathode switch 16. Also, the negative pole is connected to the work piece 7 through a work piece switch 8 and in a first path through a variable impedance device 10 connected in series with the work piece switch 8 and in a second parallel path through a bypass switch 9, also connected in series with the work piece switch. A control and monitoring unit 15 is connected at least to the work piece switch 8 and the bypass switch 9 but preferably also to the variable impedance device 10 and to the cathode switch 16.

In the process chamber 2 pulses are applied for producing plasmas, the plasmas produced appearing as plasma blobs 3 located initially at the surface of the magnetron sputtering cathode 1, at some, relatively small distance thereof. The parts participating in the plasma production form an electric circuit that is called a plasma pulser and includes the magnetron sputtering cathode 1, the anode 2 or 2a, the pulsed generator 11 and the cathode switch 16. In the process chamber 2 pulses are also applied for electrically biasing the work piece 7, the plasma blob 3 created by a plasma producing pulse expanding towards the anode 2, 2a and the work piece 7 for connecting them. The parts participating in the work piece biasing form an electric circuit that is called a biasing pulser and includes the work piece 7, the anode 2 or 2a, the pulsed generator 11, the work piece switch 8, the bypass switch 9, the variable impedance device 10 and the control and monitoring unit 15.

Hence, the discharge pulses are of two kinds: discharge pulses between the anode 2, 2a and the magnetron sputtering cathode 1, these pulses also called magnetron discharge pulses or plasma production pulses, and discharge pulses, also called biasing pulses, between the anode and the work piece 7 that is also acting as a cathode. The magnetron discharge pulses are preferably produced by a pulser, i.e. the combined pulsed generator 11, working according to the method disclosed in the cited published International patent application No. WO 98/40532 and U.S. Pat. No. 6,296,742. Hence, the pulsed generator 11 can in particular include a capacitor acting as an accumulator for electric charge and thus for energy. Alternative energy sources for the pulsed generator can, as disclosed in said patent application and patent, include an inductance or a fly-wheel, see e.g. the cited U.S. Pat. No. 6,296,742, col. 5, lines 55-60.

The cathode switch 16 is used only for disconnecting the pulsed generator 11, i.e. the pulser, from the magnetron cathode 1 in the case of transformation of the magnetron discharge into an arc discharge. Thus, the cathode switch can be called an arc suppression switch. The work piece and bypass switches 8 and 9 are provided to disconnect, in a similar way, the work piece 7 from the pulsed generator 11 if the discharge between the anode 2, 2a and the work piece 7 in an undesired way would be transformed into an arc discharge.

Hence, pulsed discharges, called magnetron discharges, periodically appear between the anode 2, 2a and the magnetron sputtering cathode 1 as driven by the voltage applied by the pulsed generator 11 between the anode and the magnetron cathode. A discharge between the anode and the work piece 7 appears automatically practically at the same time as the magnetron discharge starts, with a relatively very short delay time less then 1 μs, also driven by the same applied voltage. It is so because of the extremely fast expansion of the plasma, that is created in the crossing fields at the area of the magnetron cathode 1, up to the area at the work piece 7. No discharge between the anode 2, 2a and the work piece would thus normally be created if the magnetron cathode would be disconnected from the pulsed generator 11. Therefore, the start of the work piece biasing pulses, also called only biasing pulses, corresponding to the work piece discharges, are automatically synchronized with the magnetron pulses, the magnetron pulses thus driving the magnetron discharges. In other words, the magnetron pulsed plasma triggers the work piece pulses, i.e. the biasing pulses. The work piece discharges and thereby the biasing pulses are terminated after a complete plasma decay. After such a decay there is no electric conductivity between the anode 2, 2a and the work piece 7 and the electric current from the anode to the work piece is equal to zero. The timing of connecting and disconnecting the switches 8, 9, 16 is as follows:

These switches are usually or normally in a closed state and the pulsed generator 11 provides the voltage and current for starting/driving the discharges. The switches are opened if:

the magnetron discharge of glow discharge type and/or of the biasing/workpiece discharge of glow discharge type is transformed into an arc discharge.

it is necessary or desired to keep the work piece 7 at a floating potential, by opening at least the work piece switch 8.

it is initially necessary or desired to connect the work piece 7 to the anode 2, 2a, in this case at least the work piece switch 8 initially being in an open state. Connection of the work piece 7 to the anode 2 can be done by closing an optional work piece switch 8', see FIG. 1a and the description below.

Hence, a basic mode of operation of the biasing pulser can be as follows. In a biasing pulse, the combined pulsed generator 11 or pulser is connected to the anode 2, 2a and the work piece 7 over a discharge gap that is part of the biasing pulser, the work piece switch 8, the bypass switch 9 and the cathode switch 16 normally all being in a closed state. If the bypass switch 9 is in a closed state, the biasing current has a maximal magnitude and only intensive work piece sputtering can be done. If the bypass switch 9 is in an open state the processing of the work piece surface depends on the magnitude of the impedance of the variable resistor 10, that works as a current limiting device. Such processes can include sputtering, interface mixing, film deposition. If at least the work piece switch 8 is in an open state, the work piece 7 has a floating potential. These cases will be discussed below, see e.g. FIG. 2. The biasing current pulse is produced by a periodical connection of the discharge electrodes to each other by the expanded pulsed plasma. As has been described above, the biasing pulse starts after the front portion of the plasma blob 3 has arrived to the anode 2, 2a and the work piece 7. The biasing pulse is terminated after decay of the plasma blob has been completed, where this can be detected by sensing that the biasing current is equal to zero. This process is repeated in time by the independent pulser 11 producing the pulsed plasma blobs.

There are two extreme operating conditions of the plasma reactor 17 for performing a surface modification of the work piece.

The first extreme operating condition of the plasma reactor is achieved if the impedance of the circuit including the negative pole of the pulsed generator 11 and the work piece 7 is equal to zero. This is the case when the control and monitoring unit 15 has commanded the work piece switch 8 and the bypass switch 9 to adopt their closed states for performing intensive sputtering of the work piece 7. Then the plasma reactor 17 operates as follows.

The pulsed generator 11 or pulser periodically applies repeated pulses, the pulses creating pulsed electric discharges in the gas supplied to the process chamber 2 by the system 14. The gas ions created bombard the surface of the magnetron sputtering cathode 1, producing a metal vapor. After a first, very short period, starting after the pulsed generator has started to apply a pulse between first electrodes comprising the anode and the magnetron sputtering cathode 1, a discharge is produced in the gas and metal vapor mixture in the process chamber. By this way gas and metal plasmas are produced having the shape of plasma blobs 3. As has already been described, the plasma expands very rapidly and after the front part of a plasma blob 3 has reached the surface of second electrodes comprising the work piece 7 and the anode 2, 2a, a discharge starts also between the anode and the work piece. Hence, the magnetron sputtering cathode 1 and the work piece 7 both are cathodes of discharges. The difference is that one of them, the magnetron cathode 1, has a magnetic field at its surface, such as in magnetically enhanced sputtering, but the other one, the work piece, has no such magnetic field. Surprisingly, it has been found that these two cathodes 1, 7, when connected to the same pulsed generator 11, act as completely independent cathodes. It means that the impedance between the magnetron cathode and the work piece, as symbolized by the block 5 in FIGS. 1a and 1b, always is relatively very large. Very large here means as a minimum probably a factor 10 more than the impedance of the anode to work piece path as symbolized by the block 4 and a factor 100 more than the impedance of the anode to magnetron cathode path symbolized by the block 6.

It has been found that even if the work piece 7 is connected to the negative pole of the pulsed generator 11 through the closed work piece switch 8 and the closed bypass switch 9, the discharge current is initially concentrated in the region between the anode 2, 2a and the magnetron sputtering cathode 1. It is so because of the magnetic confinement of the electrons by the magnetron magnetic field produced by the magnet system, not shown, of the magnetron cathode. The impedance symbolized by the block 6 of the circuit including the anode 2, 2a and the magnetron sputtering cathode 1 depends on the strength and topology of the electric and magnetic fields and the kind and properties of gas/gases in the process chamber 2. Therefore the plasma is initially concentrated near the surface of the magnetron sputtering cathode 1 and can be represented as a well shaped plasma blob 3. Because of diffusion and longitudinal losses plasma escapes from the region of magnetic confinement and very rapidly expands towards the anode 2, 2a and the work piece 7. As a result, the plasma electrically connects the anode and the work piece to each other by a characteristic impedance indicated by the block 4. After it has occurred, a biasing current appears in the circuit including the positive pole of the pulsed generator 11, the anode 2, 2a, the work piece 7, the closed work piece switch 8, the closed bypass switch 9 and the negative pole of the electric energy source 11.

The biasing current pulse obtains a shape depending on a plurality of physical parameters. In particular, its shape does not coincide with the magnetron discharge driving current pulse shape. It has been found that the impedance 6 of the path from the anode 2, 2a to the sputtering cathode 1 is about 10-20% of the impedance 4 of the path from the anode to the work piece 7 but still the current during the biasing pulse is more than sufficient to perform effective work piece etching, interface mixing and ion plating. The impedance, represented by the block 5, of the gap between the magnetron sputtering cathode 1 and the work piece 7 is very large, as has been discussed above, and hence these electrodes are in effect electrically insulated from each other during all of the discharge time.

Magnetron discharge pulses and biasing pulses are automatically synchronized by the pulsed plasma appearing in the process chamber 2. The plasma generating device includes the pulsed generator 11, gas/gases and vapor in the process chamber 2, and the anode magnetron discharge gap. It was found that discharges near the work piece 7 have about zero efficiency for plasma production compared to magnetron discharges. Also, it was found that the impedance 5 is so large that the two cathodes 1, 7 act completely independently of the fact they are both connected to the negative pole of the same pulsed generator 1. Therefore the following scheme is considered: plasma is generated by the discharge between the anode 2, 2a and the magnetron cathode 1 and the plasma is used in the gap between the anode and the work piece 7 that is also a cathode. These parts are independent because the very large impedance 5. If the work piece switch 8 and the bypass switch 9 are closed, the potential of the system including the magnetron sputtering cathode 1 and the work piece 7 is similarly determined by the potential of the magnetron sputtering cathode. In particular, the potential of the magnetron sputtering cathode depends on the magnetic field strength and the operating gas pressure and varies in the interval of a few kilovolts down to a few hundreds of volts.

In principle, the work piece 7 can be considered to be a large area Langmuir probe located in the plasma produced by the magnetron sputtering cathode 1. A typical volt-ampere characteristic of a Langmuir probe is shown in the diagram of FIG. 2. The work piece potential that is equal in magnitude to the magnetron cathode potential drop is marked as $\phi_c$. Most common it is in the interval between two hundreds of volts and two kilovolts.

It has been found that using the method described in the cited U.S. Pat. No. 6,296,742 for plasma production, the potential $\phi_{sat}$, see FIG. 2, corresponding to the ion saturation current $I_{sat}$ is about 50 V. Therefore, if the work piece switch 8 and the bypass switch 9 are closed, the biasing current density belongs to region D of the volt-ampere characteristic which is a region of ion saturation current. The absolute magnitude of the space integral ion saturation biasing current is 0.1-0.2 $I_d$ where $I_d$ is the magnetron discharge driving current.

The second extreme operating condition of the plasma reactor 17 is obtained if the impedance of the circuit including the negative pole of the pulsed generator 11 and the work piece 7 is infinitely high. This is so if the control and monitoring unit 15 has opened at least the work piece switch 8. Then the plasma reactor 17 operates as follows.

In the operating region for plasma production, that is for the magnetron plasma generator, the reactor 17 is operated as in the first extreme operating condition. In the operating region for work piece surface modification by the plasma the main difference is that the biasing current in the circuit including the work piece 7 and the negative pole of the pulsed generator 11 is equal to zero. The ion current towards the surface of work piece is determined by the thermal speed of the ions and is compensated by an electron current. Therefore the sum of these two currents is equal to zero but the ion current has a finite magnitude of a very low level. The potential of the work piece 7 is equal to the floating potential $\phi_f$, see FIG. 2, that has an absolute value well below the potential drop $\phi_c$ of the magnetron cathode. However, it has been found that even if the work piece is disconnected from the pulsed generator 11, the ion current density can be sufficient to perform some work piece surface modification such as etching, interface mixing and ion plating. This phenomenon is achievable only for very powerful high current discharges and for two-dimensional work pieces placed quite near the surface of the magnetron sputtering cathode 1. Hence, it can be said that in this operating condition the ion current to the work piece 7 is in fact the biasing current. This phenomenon is negligibly small in conventional magnetron sputter deposition methods because the plasma flow has a low intensity towards the work piece and because vapor film deposition is the dominating effect. Therefore this way of work piece processing has in practice a very limited value.

All intermediate operating conditions can occur between the two extreme operating conditions discussed above. Intermediate operating conditions can be achieved by connecting the negative pole of the electric energy source 11 and the work piece 7 in series with each other and with the variable impedance device 10. In this case the control and monitoring unit 15 commands the bypass switch 9 to adopt an open state and the work piece switch 8 a closed state. The variation of the magnitude of the impedance of the variable impedance device 10 is preferably in the range of 0-10 kOhm. By varying the impedance the biasing potential of the work piece 7 will vary in the range of $\phi_c$ to $\phi_f$, corresponding to regions D and C of the volt-ampere characteristic of FIG. 2.

This method of work piece biasing is unique by its simplicity of practical implementation. In particular, the plasma pulser and the biasing pulser can be based on the same pulsed generator 11 but have different designs of their discharge electrode systems. Obviously, the energy accumulated by the pulsed generator has to be sufficient both for plasma production and work piece biasing.

In particular, the method of work piece biasing as described above does not allow positive biasing, corresponding to regions B and A of the volt-ampere characteristic of FIG. 2.

Another method of work piece biasing can be used that includes only periodic short connecting the electric path between the work piece 7 and the magnetron sputtering cathode 1 for some relatively short time periods by operating the appropriate switches, see FIGS. 1a and 1b, i.e. the work piece switch 8 and the bypass switch 9 to adopt closed states only for said short time periods and otherwise at least the work piece switch adopting an open state, the work piece then having a floating potential. The work piece when short connected to the magnetron sputtering cathode constitutes an extra cathode that has the same potential as the magnetron sputtering cathode. Hence, the two effective cathodes 1, 7 and the anode 2, 2a then form a symmetric potential well. By this method it is possible to avoid high voltage charging of the work piece 7 by energetic secondary electrons emitted from the magnetron sputtering cathode 1 because it is being bombarded by ions, see the above cited book by D. J. Rose and M. Clark, "Plasmas and Controlled Fusion".

It was found that energetic secondary electrons preferably arise during the initial phase of each magnetron discharge, such as 0.1-10 µs after breakdown of such a discharge. The breakdown can be detected by sensing the drop of the discharge voltage, i.e. the voltage between the anode 2, 2a and the magnetron sputtering cathode 1, from the initial voltage of a driving pulse produced by the pulsed generator 11 to a voltage typical of magnetron discharges. This second voltage depends mainly on the kind of magnetron cathode material and is lower then the terminal voltage of the pulsed generator. The breakdown also can be detected by sensing the appearance of a discharge current between the anode and magnetron sputtering cathode. It can also be detected by sensing the appearance of a discharge current between the anode and the work piece 7 that also acts as a cathode.

The energetic secondary electrons can be accelerated up to a high energy in the region of the magnetron sputtering cathode potential drop and decelerated up to the initial energy in the region of the work piece cathode potential drop of said potential well. Thus, said period can be used for the short-connecting of the work piece then acting as a cathode and the magnetron sputtering cathode. This method of work piece biasing is most important for deposition on dielectric work pieces 7 and in particular for deposition on electrically conductive work pieces coated by thin dielectric films. The high electric potential arising at the dielectric film that is exposed to energetic electrons beam can result in an electric breakdown of the film. If secondary electrons are decelerated, their energy is equal to the initial energy that is of the magnitude of order of 0-15 eV, see the cited book by D. J. Rose and M. Clark.

Still another method of work piece biasing can be used. This method includes periodically disconnecting, after a driving pulse produced by the pulsed generator 11 has been applied to the discharge electrodes but before the discharge breakdown, the work piece 7 from the magnetron sputtering cathode 1 and thereafter or at the same time connecting the work piece to the anode 2, 2a. Then, it is connected again to the cathode after 0.1-100 μs after the breakdown, the breakdown being or occurring when the magnetron discharge is started. In this case the work piece acts, during said period of 0.1-100 μs, as an extra anode of discharge and hence, positively charged ions are repelled from it. The periodic connecting/disconnecting is obtained by an optional work piece switch 8' and an optional variable resistor 10' connected in series with each other in a path between the work piece 7 and the positive pole of the pulsed generator 11 or the anode 2, 2a, see FIG. 1a. By variation of the magnitude of the resistance of this resistor it is possible to vary the biasing current, see FIG. 2, in regions A and B of the volt-ampere characteristic and thereby the biasing voltage is varied. In other words, it can be said that variation of the magnitude of this resistance allows moving the working point along regions A and B of the volt-ampere characteristic of FIG. 2. This method can be used if it is necessary to avoid damage to the substrate/work piece 7 by energetic ions arising at initial stages of the magnetron discharge or to decrease the intensity of gas plasma flows bombarding the work piece 7. It was found that a sufficient variation of the resistance of the resistor 10' is in the range of 0-10 kOhm.

Another method of work piece biasing includes instead the use of two independent pulsers, one thereof being a plasma pulser and the other one being a biasing pulser.

The difference of the methods using one pulser and two pulsers is as follows.

In the case of a single pulser the pulser is used both for plasma production by pulsed discharges in the magnetron magnetic field and for plasma use by discharges between the anode 2, 2a and the work piece 7. In the operating region of plasma production the discharges are between the anode and the magnetron sputtering cathode 1. The pulsed generator 11 can for example be a pulser as described in the cited U.S. patent for V. Kouznetsov. In the operating region for plasma use the same pulser is used for the biasing discharges. As has been stated above, these discharges are independent of each other as has been experimentally proven. After the plasma producing and biasing electric current pulses have been terminated, there is some time period of plasma decay. Hence, it can be said that the plasma exists somewhat longer than the discharge current pulse.

In the case of two pulsers, i.e. two pulsed generators, a first one of them is used only for plasma production. It provides pulses creating discharges between the anode 2, 2a and the magnetron sputtering cathode 1. The second one is used for biasing. The first pulser thus generates a pulsed current across the anode cathode gap and thereby produces a pulsed plasma. This pulsed plasma arrives extremely fast at the work piece 7 and electrically connects it to the anode. Hence, an electrically conductive medium appears, for some time, between the anode and the work piece. Therefore it is not necessary to use a second current pulser for pulsed work piece biasing. The second pulser can in principle include a charged capacitor connected to the anode 2, 2a and the work piece. It has a constant terminal voltage but the pulsed biasing current appears only during the time when a plasma exists. Therefore, the plasma itself acts as a pulsed switch for the biasing discharges. The same process is achieved if the energy source used for the biasing discharges is an RF generator operating in a continuous regime. The RF pulsed current between the anode 2, 2a and the work piece appears only during the time of plasma existence. The same can be said about a high frequency generator operating in a continuous regime. Of course, both RF and high frequency generators can be pulsed. In that case their pulses have to be synchronized with those of the plasma producing pulser.

Figure 3:
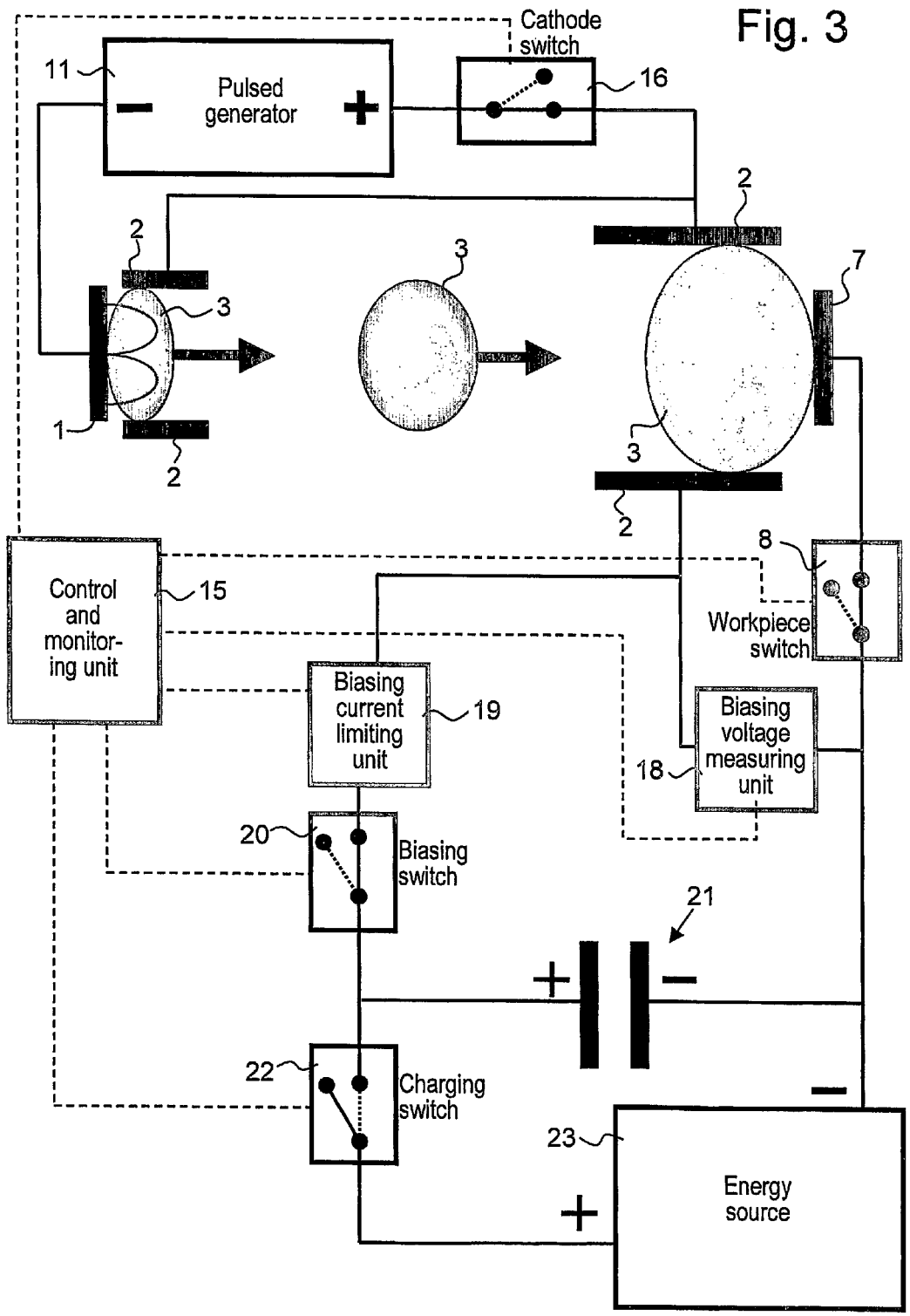
FIG. 3 is a schematic similar to FIG. 1a illustrating a plasma reactor driven by different pulsers for plasma production and work piece biasing.

It is obvious that the work piece switch 8 and the biasing switch 20, see FIG. 3, are in principle not required. The plasma itself working as a switch is sufficient for the intended process. These switches 8 and 20 are only used for:

disconnecting discharge scheme during capacitor charging time.

disconnecting the capacitor or RF generator from the work piece if the magnetron discharge is transformed into an arc discharge.

The diagram of FIG. 3 schematically illustrates the method including two pulsed generators. A first pulsed generator 11, the cathode switch 16, the magnetron sputtering cathode 1 and the anode 2 together form the plasma pulser. A second pulsed generator 21 such as a capacitor charged from some basic energy source 23 through a charging switch 22, the work piece switch 8, a biasing switch 20, a biasing current limiting unit 19, a biasing voltage measuring unit 18, the work piece 7 and the anode 2 together form the biasing pulser. The anode 2, shown in FIG. 3 as including separate parts located near the magnetron sputtering cathode 1 and the work piece 7, can as in FIG. 1a include different portions of the process chamber 2, not shown in this figure. These parts are electrically connected to each other. The control and monitoring unit 15 is connected to the various devices for controlling and monitoring them.

This system operates as follows: The plasma pulser periodically produces plasma blobs 3 as described above. The plasma blobs electrically connect, after arriving at the work piece 7, it to the anode 2. The work piece and the anode are electrodes of the pulsed biasing discharge. The second electrical energy source 21 connected to the electrodes by the work piece switch 8, the biasing switch 20 and the current limiting unit 19 produces the biasing current pulse. The pulse time is equal to the plasma decay time. The pulse repetition frequency is equal to the plasma blob repetition frequency. The biasing voltage is equal to the voltage of the second electric energy source 21. The power supply 23 defines the voltage of second electric energy source 21. The control and monitoring unit 15 produces signals for performing the following operations.

Keeping the cathode switch 16 closed, when a plasma is produced by a driving voltage pulse applied from the first pulsed generator 11 to start a discharge that results in a plasma blob 3 being created at the cathode 1.

At the time of electrical connection of the anode 2 and the work piece 7 by the plasma blob, e.g. as detected by appearance of a non-zero biasing current, after the plasma blob 3 has moved or spread over the biasing discharge gap, closing the work piece switch 8 and the biasing switch 20 and thereby forming an electrical circuit/path between the second pulser 21 and the discharge gap. Thereby the biasing current pulse is initiated.

At the same time of electrical connection of the anode 2 and work piece 7 by the plasma blob 3, opening the charging switch 22 and by this way terminating the charging of the capacitor of the second energy source 21.

After complete plasma blob decay at the anode 2/workpiece 7, as determined by e.g. appearance of a zero biasing current, opening the work piece switch 8 and the biasing switch 20 and closing the charging switch 22 and by this way initiating the charging process of the capacitor of the second pulser 21 from the energy source 23.

Repeating the operations described above periodically in time.

During the time of the biasing pulse, the control and monitoring unit 15 commands the opening of the biasing switch 20 if the current limiting unit 19 indicates that the magnitude of the biasing current is above a predetermined value. The opening of the biasing switch 20 during the biasing pulse prevents short-circuit operation. It may happen because a concentrated or diffused arc can be formed between the work piece 7 and the anode 2. It can be said that the biasing switch 20 is an arc suppression component.

Both methods including one power supply both for plasma production and plasma use and two power supplies, one for plasma production and one for biasing, as described above allow raising the biasing voltage up to a few kilovolts.

However, it was found that if in the plasma blob 3 the rate of gas and vapor ionization as well as the plasma density are high, efficient etching, interface mixing, bulk diffusion and ion plating is achievable by a biasing voltage in the range of 200-500 V.

A high plasma density results in a high biasing current magnitude that can be of the magnitude of order of kiloamperes. Therefore the pulsed power of a low duty cycle biasing pulse can be of the magnitude of order of a few megawatts. The parameters of the biasing pulse depend on the area of the work piece 7, the area of the magnetron sputtering cathode 1, and the distance between the work piece and the magnetron sputtering cathode. The characteristic parameters of the biasing pulses for different magnetron sputtering cathodes are shown in Table 1.

instead be a DC power supply, a high frequency pulsed power supply or an RF power supply, these embodiments not shown in the figure.

Different energy sources connected to the biasing discharge gap form different biasing current pulser circuits. Plasma blobs that arrive at the discharge gap electrodes which include the work piece and the anode initiate the pulser. The biasing pulse is terminated after complete plasma decay. The plasma blobs are produced by the independent plasma source that is the magnetron sputtering cathode operating in a pulsed regime. The duty cycle depends on the frequency of plasma blob production and the time of plasma decay, the latter quantity being the biasing current pulse time.

The shape of the biasing current pulses for different kinds of energy sources is schematically illustrated in FIGS. 4a-4d.

Figure 4A:
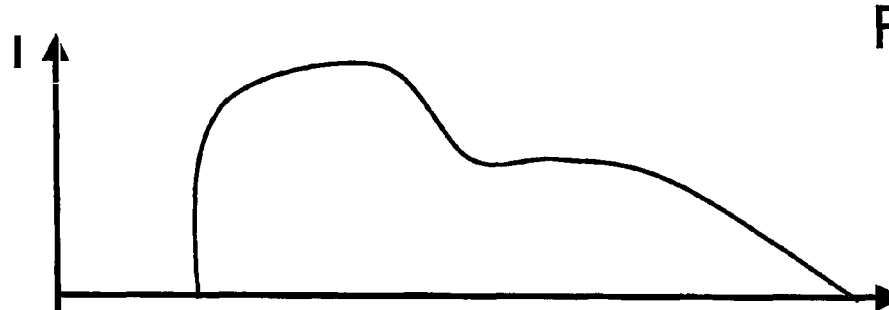
FIGS. 4a-4c are diagrams showing the shape of biasing current pulses for different kinds of energy sources.

FIG. 4a is a diagram illustrating the biasing current pulse shape for second pulsers based on charged capacitors and for DC energy sources.

Figure 4B:
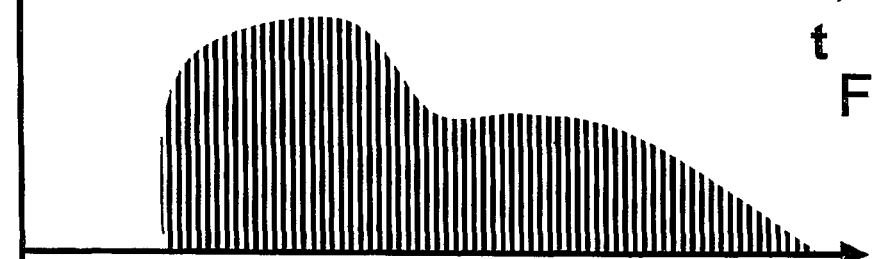

FIG. 4b is a diagram illustrating the biasing current pulse shape for a single polarity high frequency pulsed energy source operating in a continuous regime used as the second electric energy source.

Figure 4C:
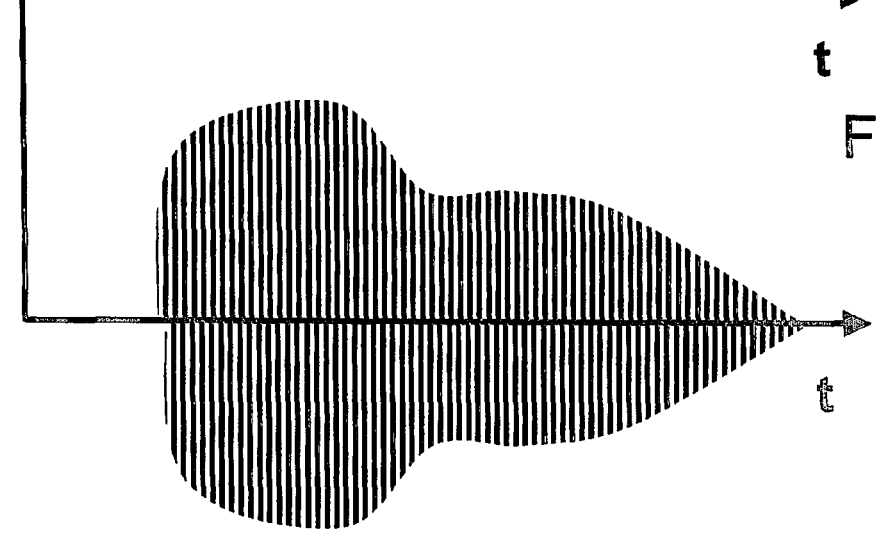

FIG. 4c is a diagram illustrating the biasing current pulse shape for a reversed polarity high frequency pulsed energy source and for an RF source both operating in continuous regimes used as the second electric energy source.

Figure 4D:
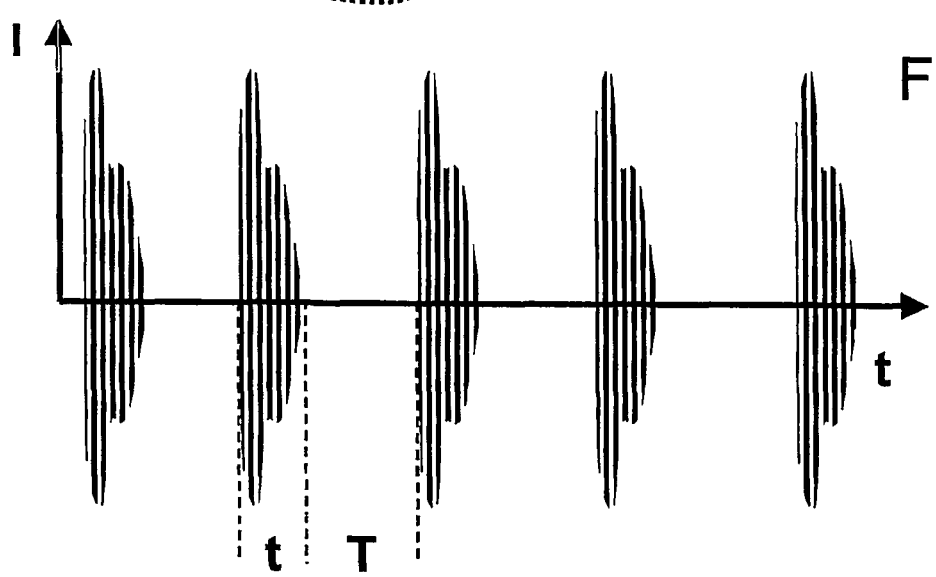
FIG. 4d is a diagram illustrating the periodic nature of the biasing current pulses.

FIG. 4d is a schematic illustrating the biasing current pulser periodical operation. The duty cycle is $\tau=t/T$, where t is the plasma decay time and T is the period of plasma blob production.

While specific embodiments of the invention have been illustrated and described herein, it is realized that numerous additional advantages, modifications and changes will readily occur to those skilled in the art. Therefore, the invention in its broader aspects is not limited to the specific details, representative devices and illustrated examples shown and

TABLE 1

| PARAMETER | Low dimension | Medium dimension or cluster of low dimension | Large dimension or cluster of medium dimension |
|---|---|---|---|
| Cathode space range, cm$^2$ | 10 | 100 | 1000 |
| Biasing voltage, V | (−)5000–(+)5000 in particular (−)500–(+)500 | (−)5000–(+)5000 in particular (−)500–(+)500 | (−)5000–(+)5000 in particular (−)500–(+)500 |
| Biasing pulsed current, A | 0–20 | 0–200 | 0–2000 |
| Biasing pulsed power, W | 0–40 kW | 0–400 kW | 0–4 MW |
| Work piece power density W/cm$^2$ | 0–10$^5$ | 0–10$^5$ | 0–10$^5$ |
| Pulse repetition frequency, Hz | 20–2·10$^4$ | 20–2·10$^4$ | 20–2·10$^4$ |
| Duty cycle | 1–1·10$^{-4}$ | 1–1·10$^{-4}$ | 1–1·10$^{-4}$ |
| Pulse length | Equal to magnetron discharge pulse length | Equal to magnetron discharge pulse length | Equal to magnetron discharge pulse length |

It was found that the parameters of the biasing discharge given in this table allow an efficient heating of the work piece bulk up to hundreds of degrees C. what can be advantageous.

It was found that the work piece power density given in the table allows pulsed heating of the surface layer of the work piece up to a temperature significantly higher than work piece bulk temperature.

A high power of the biasing discharges can be achieved by the use of a high significance capacitor 21 charged up to kilovolts and connected to the biasing discharge gap according to FIG. 3. For the range of low and medium power, the second electric energy source used for the biasing pulses can described herein. Accordingly, various modifications may be made without departing from the spirit or scope of the general inventive concept as defined by the appended claims and their equivalents. It is therefore to be understood that the appended claims are intended to cover all such modifications and changes as fall within a true spirit and scope of the invention.

The invention claimed is:
1. A method of processing a work piece by pulsed electric discharges in metal-gas plasmas comprising the steps of:
   providing a vacuum in a processing chamber,
   providing sputtering and reactive gases in the processing chamber, producing pulsed discharges with a duty cycle of $1*10^{-7}\%$ to 10% in gas and vapor located between first electrodes including an anode and a magnetron sputtering cathode for creating plasma blobs of ionized gas and partially ionized metal plasma by providing a pulsed current to the first electrodes from a first pulse generator, the plasma blobs moving or spreading from a region at a surface of the magnetron sputtering cathode towards second electrodes including the work piece and the anode, and applying a potential to the work piece from a second pulse generator including a DC power supply for charging a capacitor, wherein the potential is applied to the work piece in such a way that a pulsed current comprising biasing pulses arises between the second electrodes, the biasing pulses being produced from a charge of the capacitor, the biasing pulses of the pulsed current between the second electrodes having or appearing with the same frequency as the pulsed discharges.

2. The method according to claim 1, wherein the potential is applied to the work piece so that biasing discharges are produced between the anode and the work piece when said plasma blobs have spread to regions at the anode and at the work piece, the pulsed current comprising the biasing pulses being the current of the biasing discharges.

3. The method according to claim 1, wherein the potential is applied to the work piece in such a way that the biasing pulses coincide in time with pulses to create the pulsed discharges between the first electrodes.

4. The method according to claim 1, wherein the potential is applied to the work piece in such a way that the biasing pulses exist as long as a plasma exists.

5. The method according to claim 1, wherein the potential is applied to the work piece in such a way that the biasing pulses start simultaneously with the pulsed discharges between the first electrodes in which plasmas are created and are terminated after the end of the decay of the plasmas created.

6. The method according to claim 1, wherein said pulsed discharges are provided by a first high current pulse supply and said biasing pulses are provided by a second high current pulse supply.

7. The method according to claim 1, wherein the magnetron sputtering cathode and the work piece are connected to the negative pole of different high current pulse supplies.

8. The method according to claim 1, wherein said frequency of said biasing pulses and said pulsed current is 20 Hz-20 kHz.

9. The method according to claim 1, wherein a biasing current of the biasing pulses has a magnitude that is at least 10% of a magnitude of a magnetron discharge current of the pulsed discharges.

10. The method according to claim 1, characterized in that said biasing pulses and said pulsed discharges are synchronized.

11. The method according to claim 1, characterized in that said pulsed discharges are produced by a pulse generator including a capacitor acting as accumulator for an electric charge, where energy stored in said capacitor is used to produce said discharges.

12. A method of processing a work piece by pulsed electric discharges in metal-gas plasmas comprising the steps of:

providing a vacuum in a processing chamber, providing sputtering and reactive gases in the processing chamber, producing pulsed discharges in gas and vapor between first electrodes including an anode and a magnetron sputtering cathode for creating a plasma by providing a pulsed current to said first electrodes from a first pulse generator, wherein said pulsed discharges have a duty cycle of $1*10^{-7}\%$-10%, applying a potential from a second pulse generator including a DC power supply for charging a capacitor to the work piece in such a way that a pulsed current comprising biasing pulses arises between second electrodes including the work piece and the anode, the biasing pulses being produced from a charge of said capacitor, the biasing pulses of the pulsed current between the second electrodes having or appearing with the same frequency as the pulsed discharges.

13. The method according to claim 12, wherein the pulsed discharges are provided by a first high current pulse supply and said biasing pulses are provided by a second high current pulse supply.

14. The method according to claim 12, wherein the magnetron sputtering cathode and the work piece are connected to the negative pole of different high current pulse supplies.

15. The method according to claim 12, wherein said frequency of said biasing pulses and said pulsed current is 20 Hz-20 kHz.

16. The method according to claim 12, wherein a biasing current of the biasing pulses has a magnitude that is at least 10% of a magnitude of a magnetron discharge current of said pulsed discharges.

17. The method according to claim 12, wherein the biasing pulses and the pulsed discharges are synchronized.

18. The method according to claim 12, wherein the pulsed discharges are produced by a pulse generator including a capacitor acting as accumulator for an electric charge, and wherein energy stored in the capacitor is used to produce the discharges.

19. The method according to claim 1, wherein a biasing switch is provided between the second pulse generator and the work piece, and wherein the biasing switch is opened if the magnitude of the pulsed current between the second electrodes is above a predetermined threshold.

20. The method according to claim 19, wherein the biasing switch is an arc suppression component, which opens if a concentrated or diffused arc forms between the work piece and the anode.

21. The method according to claim 19, wherein the biasing switch is a solid state switch.

22. The method according to claim 12, wherein a biasing switch is provided between the second pulse generator and the work piece, and wherein the biasing switch is opened if the magnitude of the pulsed current between the second electrodes is above a predetermined threshold.

23. The method according to claim 22, wherein the biasing switch is an arc suppression component, which opens if a concentrated or diffused arc forms between the work piece and the anode.

24. The method according to claim 22, wherein the biasing switch is a solid state switch.

* * * * *

UNITED STATES PATENT AND TRADEMARK OFFICE
CERTIFICATE OF CORRECTION

PATENT NO. : 8,262,869 B2
APPLICATION NO. : 10/563864
DATED : September 11, 2012
INVENTOR(S) : Vladimir Kouznetsov Page 1 of 1

It is certified that error appears in the above-identified patent and that said Letters Patent is hereby corrected as shown below:

Title Page: Item 73

The Assignee listed on the issued patent is erroneous. Correction is therefore requested to correct the Assignee name on the issued patent to read: Cemecon AG (Wurselen, Germany).

Signed and Sealed this
Twelfth Day of February, 2013

Teresa Stanek Rea
*Acting Director of the United States Patent and Trademark Office*